United States Patent
Kraipak et al.

(10) Patent No.: US 10,204,698 B2
(45) Date of Patent: Feb. 12, 2019

(54) METHOD TO DYNAMICALLY INJECT ERRORS IN A REPAIRABLE MEMORY ON SILICON AND A METHOD TO VALIDATE BUILT-IN-SELF-REPAIR LOGIC

(71) Applicant: Ampere Computing LLC, Santa Clara, CA (US)

(72) Inventors: Waseem Kraipak, Kalyani Nagar Pune (IN); Babji Vallabhaneni, Santa Clara, CA (US); Vijay Parmar, Santa Clara, CA (US); Mitrajit Chatterjee, Santa Clara, CA (US)

(73) Assignee: AMPERE COMPUTING LLC, Santa Clara, CA (US)

( * ) Notice: Subject to any disclaimer, the term of this patent is extended or adjusted under 35 U.S.C. 154(b) by 24 days.

(21) Appl. No.: 15/384,437

(22) Filed: Dec. 20, 2016

(65) Prior Publication Data

US 2018/0174665 A1    Jun. 21, 2018

(51) Int. Cl.
| | | |
|---|---|---|
| G11C 29/00 | (2006.01) | |
| G11C 29/38 | (2006.01) | |
| G11C 29/44 | (2006.01) | |
| G11C 29/36 | (2006.01) | |
| G11C 29/02 | (2006.01) | |

(52) U.S. Cl.
CPC .............. *G11C 29/38* (2013.01); *G11C 29/02* (2013.01); *G11C 29/36* (2013.01); *G11C 29/4401* (2013.01)

(58) Field of Classification Search
CPC ...... G11C 29/38; G11C 29/4401; G11C 29/36
See application file for complete search history.

(56) References Cited

U.S. PATENT DOCUMENTS

| | | | |
|---|---|---|---|
| 6,691,264 B2 | 2/2004 | Huang | |
| 7,228,468 B2 | 6/2007 | Wu et al. | |
| 7,284,166 B2 | 10/2007 | Zappa et al. | |
| 7,472,051 B2 | 12/2008 | Mariani et al. | |
| 7,627,792 B2 | 12/2009 | Di Ronza | |
| 7,913,125 B2 | 3/2011 | Agrawal et al. | |

(Continued)

OTHER PUBLICATIONS

WIPO Application No. PCT/US2017/067183, International Search Report and Written Opinion of the International Searching Authority, dated Apr. 18, 2018.

*Primary Examiner* — Samir W Rizk
(74) *Attorney, Agent, or Firm* — Alston & Bird LLP

(57) ABSTRACT

An error injection system of a built-in self-repairable memory system renders the redundant spare columns of the repairable memory accessible to built-in self-test (BIST) read and write operations. To this end, the error injection system selectively injects fault data at one or more locations of the main memory during a BIST sequence, causing the BIST controller to issue a repair instruction that allocates one or more spare columns as replacement memory areas for the presumed faulty main memory locations. Thereafter, BIST read/write operations directed to the main memory locations will be performed on the allocated spare columns, thereby allowing the spare columns to be validated as part of the BIST. Injection of fault data to the main memory locations in this manner can also facilitate validation of the built-in self-repair logic by verifying the repair instruction codes that are generated in response to the injected faults.

15 Claims, 9 Drawing Sheets

(56) References Cited

U.S. PATENT DOCUMENTS

| | | |
|---|---|---|
| 8,358,548 B2 | 1/2013 | Manna et al. |
| 8,873,318 B2 | 10/2014 | Shvydun et al. |
| 2004/0210803 A1 | 10/2004 | Cheng et al. |
| 2012/0144244 A1* | 6/2012 | Dan .................. G11C 29/10 |
| | | 714/39 |
| 2013/0021860 A1* | 1/2013 | Shvydun ............ G11C 29/4401 |
| | | 365/200 |
| 2013/0021861 A1 | 1/2013 | Shvydun et al. |
| 2014/0019818 A1* | 1/2014 | Jindal .................. G06F 21/556 |
| | | 714/724 |
| 2014/0217406 A1 | 8/2014 | Thomas |
| 2016/0125959 A1 | 5/2016 | Otterstedt et al. |

* cited by examiner

METHOD TO DYNAMICALLY INJECT ERRORS IN A REPAIRABLE MEMORY ON SILICON AND A METHOD TO VALIDATE BUILT-IN-SELF-REPAIR LOGIC

TECHNICAL FIELD

The subject disclosure relates generally to built-in self-repairable memory systems.

BACKGROUND

Many integrated circuits, such as system-on-chip (SoC) designs or other very-large-scale-integration (VLSI) systems, include a large number of high-density embedded memories. Defects in these memories can result in reduced memory yield and overall unreliability. In order to maintain yield and reliability, many embedded memories support built-in self-repair (BISR) functions that test for defects, perform a repair analysis when defects are detected, and implement a repair operation that allocates a redundant memory location as a replacement for a faulty region. Accordingly, BISR memories (BISRMs) typically include a number of redundant spare columns, in addition to the main memory banks, which serve as redundant memory locations that can be allocated as needed when an address of the main memory area is found to be defective.

The testing of a BISR memory (BISRM) is often carried out by an on-chip built-in self-test (BIST) controller that writes test data to, and reads the test data back from, a range of memory locations according to a defined sequence in order to identify defective memory areas. However, while the main memory banks of an embedded memory can be effectively tested and validated in this manner by the BIST controller, the spare memory columns of the BISRM memory typically cannot be accessed for test data read and write operations, since these redundant memory areas can only be accessed in the event of a fault on the main memory.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In one or more embodiments, a memory system is provided, comprising a built-in self-repairable memory (BISRM) comprising a main memory area and a redundant memory area comprising at least one spare column; a built-in-self test (BIST) controller configured to validate memory locations of the main memory area by writing test data to the memory locations via a test data bus; and an error injection system configured to inject fault data to a memory location, of the memory locations, via the test data bus.

Also, according to one or more embodiments, a method is provided, comprising setting fault configuration data specifying a target memory location of a set of memory locations of a main memory area of a built-in self-repairable memory (BISRM); initiating a built-in self-test (BIST) on the BISRM, wherein the BIST comprises writing test data to one or more of the set of memory locations via a test data bus; and in response to determining that a test address pointer of the BIST is equal to the target memory location: preventing writing of the test data to the target memory location, and writing fault data to the target memory address via the test data bus.

In addition, computer-readable medium is provided having stored thereon executable instructions that, in response to execution by a processor, causes a memory system to perform operations, the operations comprising setting a fault address value of a fault test data register, the fault address value defining a target fault memory address of a built-in self-reparable memory (BISRM); initiating a built-in self-test (BIST) on the BISRM, wherein the BIST comprises writing test data to memory locations of the BISRM via a test data bus; and in response to determining that a current target address of the test data is equal to the target fault memory address: preventing writing of the test data to the current target address, and writing fault data to the current target memory address via the test data bus.

DETAILED DESCRIPTION

Figure 1:
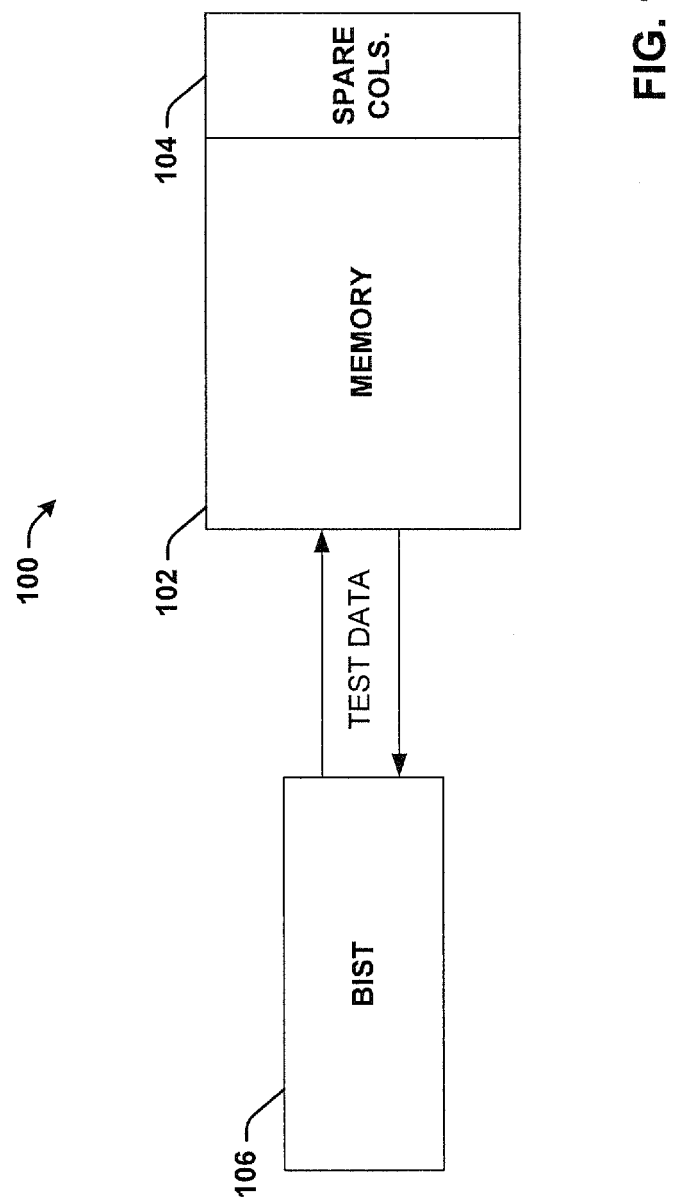
FIG. 1 is a generalized block diagram of a built-in self-repairable memory (BISRM) and associated built-in self-test (BIST) controller.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

FIG. 1 is a generalized block diagram of a built-in self-repairable memory (BISRM) 100 and associated built-in self-test (BIST) controller 106. BISRM 100 comprises a main memory bank 102 and a number of spare columns 104, which serve as redundant memory areas capable of replacing defective sections of the main memory bank 102. BIST controller 106 may be, for example, an on-chip hardware component associated with BISRM 100 that executes BISR logic or code to facilitate testing the BISRM 100 for faults or defects and effecting repairs when a defect is detected. In some implementations, BIST controller 106 can execute a defined sequence of write operations to different locations (e.g., memory addresses) of the main memory bank 102 and read the written data back from the respective locations in order to confirm that the expected data value is obtained. If the read operation obtains a different value that the test value that was written during test write operation, the memory location is assumed to be defective. If a faulty memory location (e.g., a faulty column of the main memory bank 102) is detected, BIST controller 106 can replace the faulty memory location with one or more of the spare columns 104; e.g., by mapping the faulty location of the main memory bank 102 to the selected one or more spare columns such that data reads and writes directed to the faulty memory location are instead performed against the spare memory location.

Figure 2:
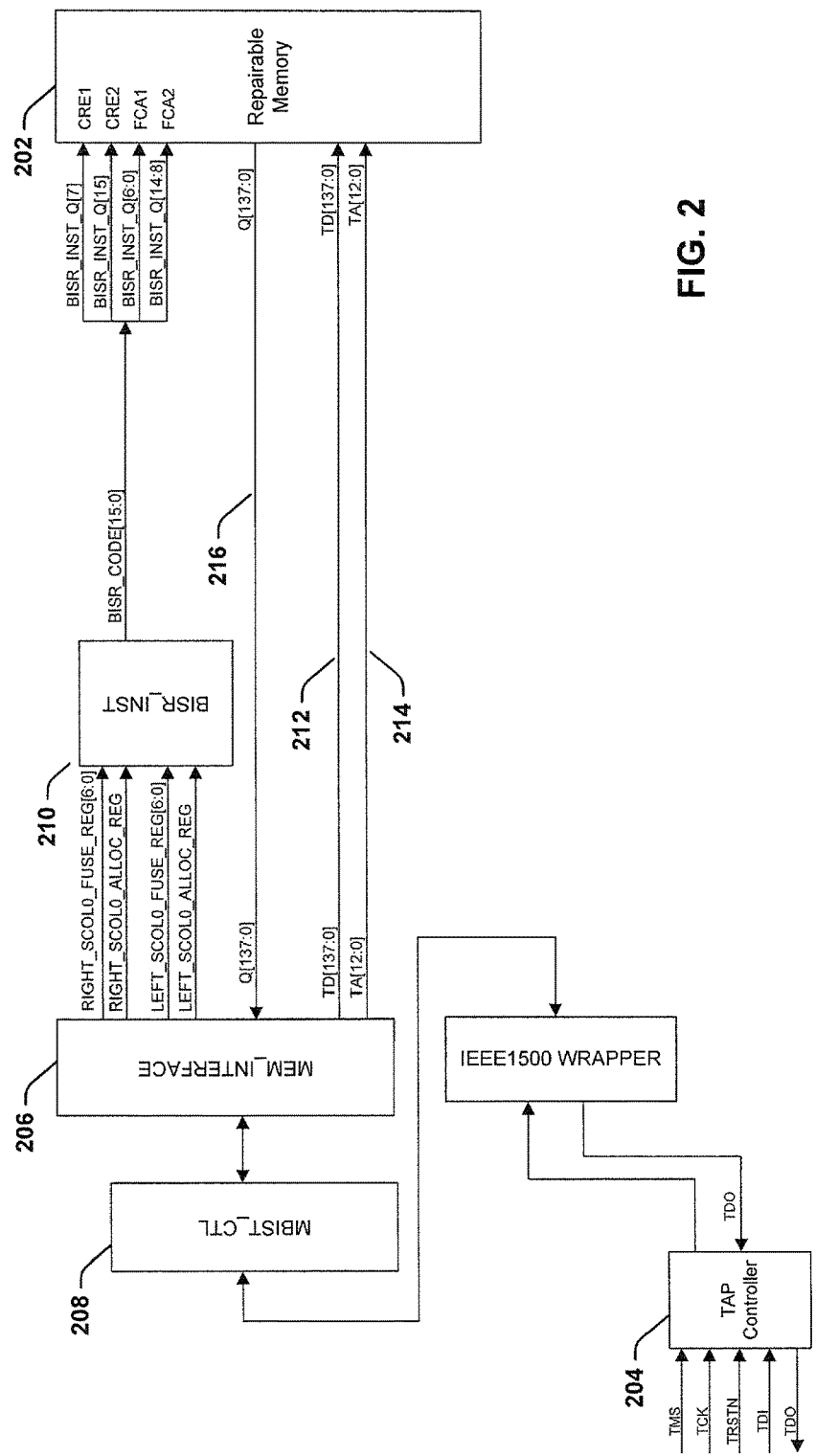
FIG. 2 is a block diagram illustrating function blocks and registers that carry out a built-in self-test on a BISRM memory.

FIG. 2 is a more detailed block diagram illustrating function blocks and registers that carry out a built-in self-test according to an example implementation. In this example, repairable memory 202 is tested and validated using a BIST sequence executed by the BIST controller. In the example illustrated in FIG. 2, a Joint Test Action Group (JTAG) interface connected to a test access port (TAP) controller 204 allows a user to interface with the BIST controller in order to initiate a BIST sequence, view results, configure register values, or perform other user interface functions. However, embodiments described herein are not limited to systems that use a JTAG interface as the user interface.

In the example architecture illustrated in FIG. 2, the user can initiate the BIST controller via TAP controller 204. BIST controller 208 initiates reads to and writes from the memory 202, which are sent via memory interface 206. The test data (TD) bus 212 is used to write test data to the memory 202 under test, while the Q bus 216 is used to read data from the memory 202. The test address (TA) bus 214 is used to set the target memory address during a test data write or read operation, acting as an address pointer during the BIST. The writes and reads are controlled by test logic executed by the BIST controller 208, which defines a testing sequence whereby data values are written to selected locations of memory 202 and the values are read back from the locations to ensure that each memory location is free of defects (other techniques for testing the various memory locations are also possible). If a memory location is found to be defective, the BIST controller issues a repair instruction via memory interface 206 and BISR instruction block 210 that maps the defective memory location to one or more of the spare columns 104, which serve as redundant or backup memory locations. The repair sequence, whereby a faulty memory location is mapped to a selected redundant memory location, is controlled by BISR logic executed by the BIST controller 208 or another element of the memory architecture.

Conventionally, the BIST controller is only capable of testing and validating memory locations of the main memory bank 102, but cannot access the spare columns 104 to perform testing and validation of the redundant memory. This is because the memory system only allows the spare columns to be accessed if there is a fault in the main memory. Some approaches seek to validate these redundant memory areas using a simulation or model of the memory. However, tests that are applied to simulations may not produce reliable validation results since the test data read and write operations are not applied directly to the silicon that makes up the redundant memory areas.

To address these issues, one or more embodiments set forth in this disclosure provide an error injection system and method that improves reliability of BISRM validation by allowing the redundant memory areas e.g., spare columns to be writing test values to and reading test values from the redundant memory areas directly on the silicon. To these ends, the error injection system described herein mimics faults on selected areas of the main memory as part of the BIST sequence. These simulated faults cause the memory system to initiate repair operations that allocate one or more spare columns to replace the presumed defective memory areas, thereby rendering the spare columns accessible to test writes and reads. By enabling the spare columns using injected faults, the error injection system allows the BIST system to perform test write and read operations on the spare columns to ensure that those redundant memory areas are free of faults or defects. As an additional benefit, the techniques described herein for validating the spare columns can also be used to confirm proper operation of the BISR logic for different memory addresses.

Figure 3:
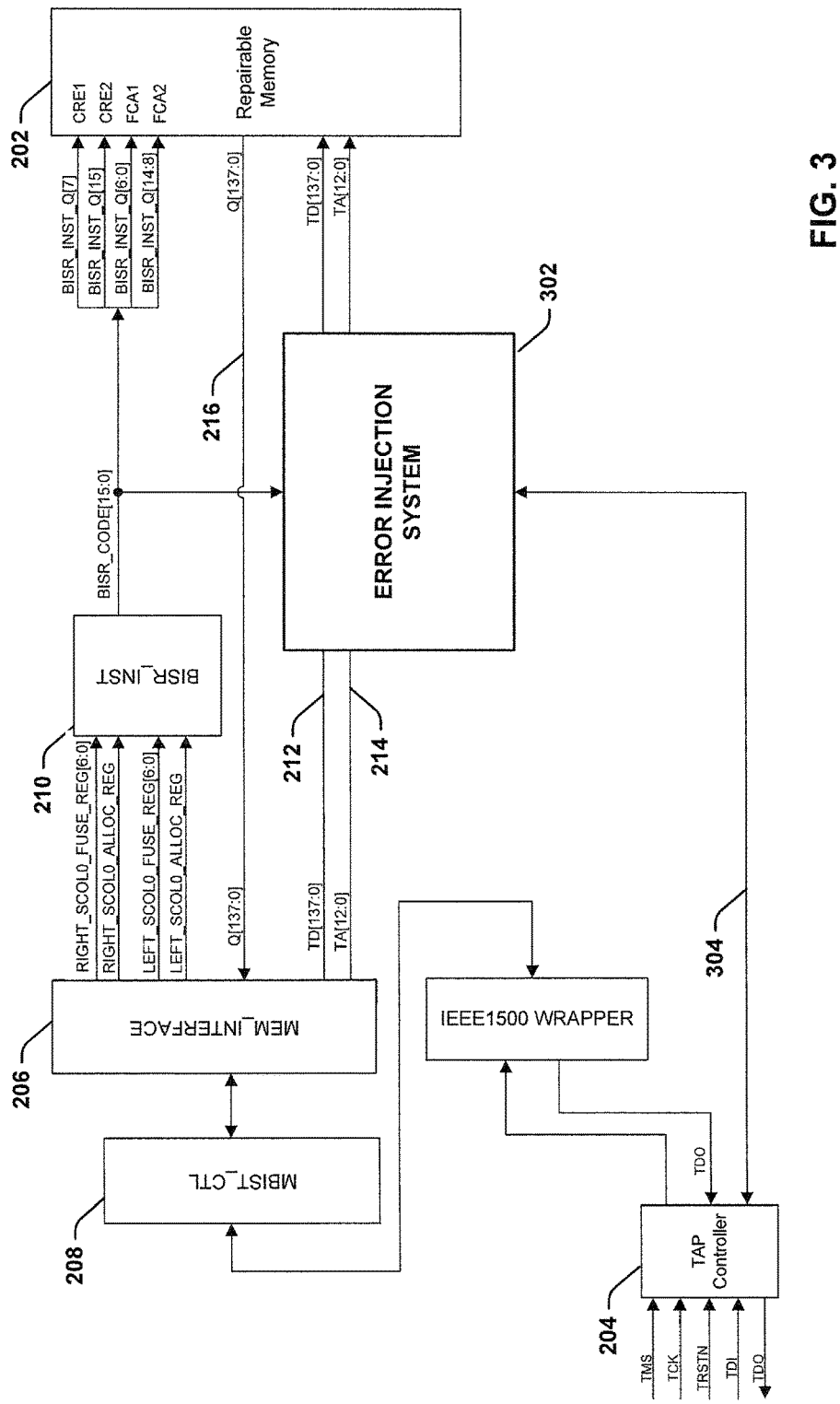
FIG. 3 is a block diagram of a BISRM memory architecture that includes an error injection system configured to inject fault data at selected memory locations or addresses to facilitate access to the memory's spare columns during a BIST.

FIG. 3 is a block diagram of a BISRM memory architecture that includes an error injection system 302 configured to inject error data at selected memory locations or addresses to facilitate access to the memory's spare columns during a BIST sequence. The components or functional blocks that make up error injection system 305 can comprise hardware, software, or a combination of hardware and software implemented as part of the memory system's architecture. In the example architecture depicted in FIG. 3, error injection system 302 is located in-line with the test data (TD) bus 212 and the test address (TA) bus 214 between the memory interface 206 and repairable memory 202. As will be described in more detail below, the error injection system 302 is configured to allow normal test data that is output on the TD bus 212 by memory interface 206 to pass to the repairable memory 202 during normal operation. When it is desired to mimic an error or fault at a selected memory address during the BIST, the error injection system 302 can block the normal test data on the TD bus 212 and inject a fault value (e.g., a value that is different than the normal test data value that the BIST controller 208 attempts to write to the address) on the test data input of the repairable memory 202, so that the fault data will be written to the desired memory address.

Since the fault data value is different that the test data value that the BIST controller had attempted to write to the address, the subsequent data read operation of the BIST sequence will detect that the incorrect data value was read from the memory address and initiate a repair operation on the address. The repair operation is performed by BISR logic executed by the BIST controller 208 or another component of the memory architecture. In some embodiments, the repair is performed by generating and outputting a BISR code or other repair instruction, which is sent to the repairable memory 202 by the BISR instruction block 210; e.g., by writing the BISR code to a BISR instruction register (BISR_CODE[15:0]). In some embodiments, the BISR code contains information identifying the presumed faulty memory address as well as other information that, when written to a fuse register associated with the repairable memory 202, causes the faulty memory address to be mapped to a redundant memory area (e.g., a spare column). Thus, subsequent read and write operations directed to the memory address will instead be performed on the redundant memory area allocated to the main address. The BIST can then be re-executed normally, without error injection, allowing the redundant memory area (e.g., spare column) to be tested and validated using direct test data read and write operations. Alternatively, the BIST can be run a second time with error injection still enabled for the same memory address, allowing an error to be mimicked on the spare column. As will be described in more detail below, this latter technique can be used to verify that the BISR logic is generating the correct BISR code in all circumstances, thereby validating the BISR logic itself.

The error injection system 302 also includes an interface 304 to the TAP controller 204 (or other user interface) that allows a user to write data to and read data from the system 302. The error injection system 302 also interfaces with the output of BISR instruction block 210 so that BISR codes can be read and verified. As will be described in more detail below, this allows the error injection system 302 to validate the BISR logic itself as well as the main memory and redundant memory areas of repairable memory 202.

Figure 4:
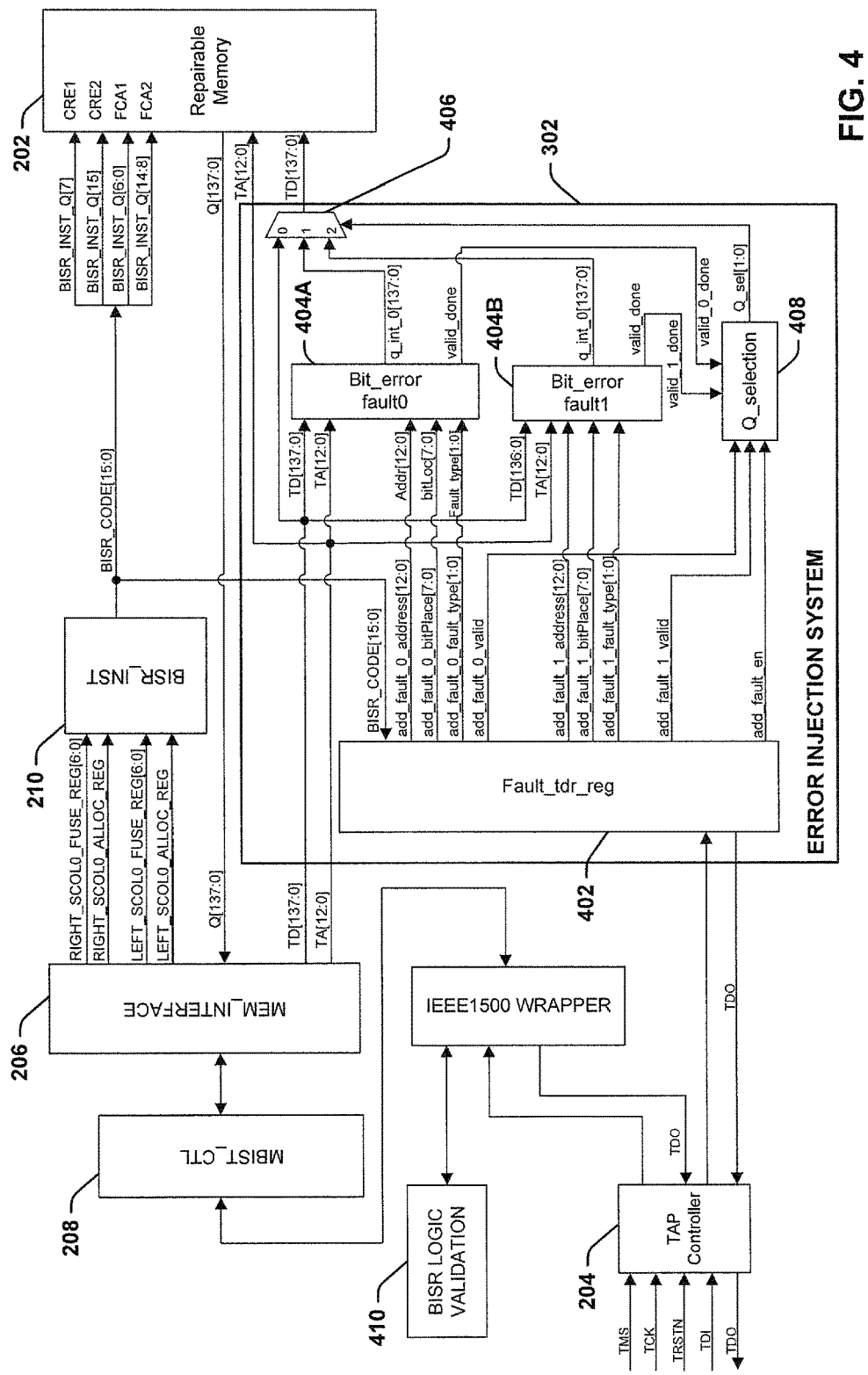
FIG. 4 is a block diagram of an example, non-limiting implementation of error injection system.

FIG. 4 is a block diagram of an example, non-limiting implementation of error injection system 302. It is to be appreciated that the configuration of registers and components illustrated in FIG. 4 is only intended to be exemplary, and that other arrangements of components capable of carrying out the error injection techniques described herein are also within the scope of one or more embodiments of this disclosure.

The BISR memory architecture depicted in FIG. 4 includes function blocks and registers that perform BIST testing and validation on repairable memory 202, including redundant memory areas. In this example, the architecture illustrated in FIG. 2 has been modified to include a fault test data register (fault_tdr_reg) 402, a Q selection component 408 that executes Q selection logic, and bit error injection component 404A and 404B that implement bit error injection logic. The Q selection logic and bit error injection logic can comprise glue logic implemented using any combination of digital circuitry and programmable logic code. Although the architecture depicted in FIG. 4 includes two bit error injection components 404, it is to be appreciated that the error injection system 302 can include any number of error injection blocks without departing from the scope of one or more embodiments of this disclosure. Moreover, while FIG. 4 and the following description describes injection of single-bit fault data, some embodiments can also be configured to inject multi-bit fault data.

The fault test data register 402 includes sets of words and bits corresponding to each of the bit error injection components 404. For each bit error injection component, fault test data register 402 includes Fault Address and Bit Location words (add_fault_x_address and add_fault_x_bitPlace, where "x" is an integer corresponding to one of the bit error injection components 404) for specifying the address and bit place, respectively of the repairable memory 202 to which fault data is to be written, as well a Fault Type word (add_fault_0_fault_type) used to specify the type of fault to be written. Values can be written to these registers to facilitate fault injection, either by the user via the TAP controller 204 (or another user interface) or by the BIST controller 208 as part of a predefined BIST routine. Bit error injection components 404A and 4034B write the fault data to the repairable memory 202 via multiplexer 406. Multiplexer 406 receives as inputs the normal test data sent by memory interface 206 on the test data bus (TD[137:0]), as well as fault data output by each of the bit error injection components 404 (q_int_0[137:0]). In this example, the output of each bit error injection component is the same size as the normal test data bus ([137:0]).

Q selection component 408 controls multiplexer 406 to selectively switch the test data input of the repairable memory 202 between fault data (q_int[137:0]) from bit error injection components 404 or normal test data from memory interface 206 (TD[137:0]). The decision to switch multiplexer 406 to fault injection mode—whereby the fault data outputs of the bit error injection components 404, rather than normal test data output by memory interface 206, are selected as the data input into repairable memory 202—is based on the states of the Fault Valid (addfault_x_valid) and Fault Enable (add_fault_en) outputs of the fault test data register 402. The following pseudocode represents example logic that can be implemented by Q selection component 408 to determine when to instruct multiplexor 406 to switch to fault injection mode (for an example architecture in which there are two bit error injection components 404, as in FIG. 4):

```
if(add_fault_en) begin//{
    if(add_fault_0_valid & valid_0_done)
    Q_sel=1
    elseif(add_fault_1_valid & valid_1_done)
    Q_sel=2;
    else
    Q_sel=0
    end//}
    else
    Q_sel=0
```

Where Q_sel is an integer value identifying which of the multiplexor's inputs is to be placed on the multiplexor's output line. In the present example, a Q_sel value of 0 allows normal test data to be passed to the repairable memory 202, and a Q_sel value of 1 or 2 causes the fault data from the corresponding first or second bit error injection component 404 to be sent to the repairable memory 202.

For an $x^{th}$ bit error injection component 404, the Fault Valid bit (add_fault_x_valid) of the fault test data register 402 is set high (e.g., by the user via TAP controller 204, or by the BIST controller 208 as part of the BIST sequence) when a fault is to be injected at a desired main memory address via that bit error injection component. If the Valid Done register (valid_done) for the xth bit error injection component 404 is also high at the time the Fault Valid bit is set high—indicating that the test memory address indicated by the TA bus matches the target address for the error to be injected (see the error injection pseudocode below)—the Q selection component 408 instructs multiplexor 406 to switch the input into repairable memory 202 from the normal test data input on the TD bus (Q_sel=0) to the fault injection input from the $x^{th}$ bit error injection component 404 (Q_sel=1 or 2).

The following pseudocode represents example logic that can be implemented by each of the bit error injection components 404:

```
q_int[137:0] = TD[137:0];
If(Addr[12:0]==TA[12:0])
begin//{
valid_done=1
If(fault_type==2'd0)
q_int[bitLoc]=1'b0;
else if (fault_type==2'd1)
q_int[bitLoc]=1'b1;
else
```

```
    q_int[bitLoc]=~q_int[bitLoc]
    end//}
    else
    valid_done=0
```

Where q_int is the output word of the bit error injection block.

The fault test data register 402 comprises words corresponding to a target address (Addr[12:0]), bit place (bitLoc [7:0]), and fault type (Fault_Type[1:0]) of the fault to be injected by each of the bit error injection components 404. The values of these words represent fault configuration data for the error to be injected, and are used as inputs to their respective bit error injection components 404. When the user wishes to inject a fault at a selected address of repairable memory 202 (e.g., during bench testing of the memory), the user can set the desired target address, bit place, and fault type by writing the desired configuration information to the appropriate words of fault test data register 402 via TAP controller 204 or another type of user interface, then set the Fault Enable bit (add_fault_en) of the fault test data register 402. Alternatively, the target address, bit place, and fault type, as well as the timing of fault injection, can be controlled by the BIST sequence implemented by the BIST controller 208. The address, but place, and fault type information can be set before or during execution of a BIST sequence.

After the fault target address, bit place, and fault type have been configured and the Fault Enable bit has been set, the bit error injection component waits for the test target address (TA[12:0]) controlled by the BIST controller 208 to become equal to the target address specified by the Fault Address register (Addr[12:0]) during a current BIST sequence. During the BIST sequence, the BIST controller 208 (through memory interface 206) sets the target test address on the TA bus to specify the memory address on which a current test read or test write of the BIST sequence will be performed. Typically, the BIST controller 208 will vary the target test address for multiple test data write/read operations during the BIST sequence, thereby testing multiple memory address locations during the test. In this way, the test address set by the BIST controller 208 acts as an address pointer for the test read and write operations. When the user opts to inject a fault at a desired memory address, the error injection system 302 waits for the BIST controller to set the target test address (TA[12:0]) to the user-defined target address for the fault to be injected. When the target test address TA[12:0] set by the BIST controller becomes equal to the target address set for the bit error injection component, the error injection system 302 prevents the normal test data sent by the BIST controller from being written to the memory 202, and instead writes the fault data to the target memory address.

In accordance with the example pseudocode above, when the test address set by memory interface 206 on the TA data bus (TA[12:0]) becomes equal to the fault target address Addr[12:0] defined in the fault test data register 402 for the bit error injection component 404, the selected bit error injection component 404 sets its Valid Done bit (valid_done) high, which signals Q selection component 408 to switch the output of multiplexor 406 from the normal test data input TD[137:0] to the fault data input (q_int) from the appropriate bit error injection component 404, thereby causing the fault data indicated by fault_type[1:0] to be written to the address indicated by Addr[12:0].

In the present example, bit error injection components 404 perform single-bit error injection. As such, the fault data comprises a bit value (b'0 or b'1, depending on the selected fault type) written to the indicated bit location (bitLoc[7:0]) of the indicated target address (Addr[12:0]). The fault value will be a different value than the test data value that had been generated by the BIST controller 208 and directed to the memory address over the test data bus (TD[137:0]), and will therefore cause the BIST sequence to assume the memory address is faulty when the fault data is read back from the target address (via the memory output bus Q[137:0]) during the BIST sequence. It is to be appreciated, however, that some embodiments of error injection system 302 can also support injection of multi-bit errors.

In response to detecting this presumed fault, the memory interface 206 generates repair information in the form of a BISR code, which is sent to the repairable memory 202 by the BISR instruction block 210 (e.g., by writing the BISR code to register BISR_CODE[15:0]). The BISR code contains information identifying the memory address that experienced the fault as well as other information that can be used to allocate redundant memory to the presumed faulty memory location. In some systems, the BISR code is written to a fuse register, causing a redundant spare column to be allocated to the faulty memory area. Once this repair configuration is complete, read and write operations directed to the faulty memory address will instead be applied to the allocated spare columns, thereby allowing data to be written to and read from the spare memory area. By dynamically injecting faults using the bit error injection components 404 and multiplexor 406 during the BIST sequence as described above, one or more redundant spare columns of memory 202 will be made accessible to read and write operations (by addressing such read/write operations to the memory address to which the error was injected), and the redundant spare columns can thus be tested and validated during a subsequent BIST by writing test data to and reading data from the spare columns. These test read and write operations are made directly on the silicon that makes up the memory 202, and therefore produce more reliable test results relative to simulation-based tests.

An example scenario in which the architecture depicted in FIG. 4 is used to perform BIST test read and write operations on spare columns of memory 202 is now described. In this example, to facilitate access to the spare columns so that a BIST can be performed on those memory areas, the error injection system injects faults at two different memory address locations, thereby rendering spare columns accessible to direct read and write operations.

First, the fault type, fault address, and bit location for a fault to be injected as part of the BIST sequence are set for one of the bit error injection components 404. In the present example, bit error injection component 404A is the first to be configured. The fault type, fault address, and bit location are set by writing the appropriate values to the following bits or words of the fault test data register 402:
    add_fault_0_valid (Fault Valid),
    add_fault_0_fault_type[1:0] (Fault Type),
    add_fault_0_addr[12:0] (Fault Address),
    add_fault_0_bitPlace[7:0] (Bit Location), and
    add_fault_en (Fault Enable).

These bits and words, which are used as input to the bit error injection component 404A and the Q selection component 408, can be set by the user via TAP controller 204, or by an automated BIST routine executed by a BIST controller 208. These values can be set before or during execution of a BIST sequence during which the BIST controller 208 tests and validates the various memory locations of the repairable memory 202 using test data read and write operations directed to the memory locations.

The Fault Enable (add_fault_en) bit acts as a signal to the Q selection component 408 that fault injection mode has been enabled, and the Fault Valid (add_fault_0_valid) bit acts as a signal to the Q selection component 408 that fault data for the first bit error injection component 404 is ready to be sent to the repairable memory 202 (see the example Q selection pseudocode described above). With the Fault Enable and Fault Valid bits set, the Q selection component 408 waits for the first bit error injection component 404A to set its Valid Done bit (valid_done), which occurs when the target address value TA[12:0] set by the memory interface 206 becomes equal to the target address of the fault indicated by add_fault_0_addr[12:0].

When address TA[12:0] becomes equal to the target address of the fault, the Q selection component 408 instructs multiplexor 306 to place the fault output word q_int_0[137:0] on the test data input TD[137:0] of the repairable memory 202 (see the example pseudocode for the Q selection component described above). Multiplexor 306 places the fault data on the input of the repairable memory 202 by switching the multiplexor output from the normal test data bus to the output of the bit error injection module, thereby preventing the normal test data on the TD bus from being written to the target address and instead causing the fault data to be written to the address. Output word q_int_0[137:0] of the bit error injection component 404A contains the bit error value (either b'0 or b'1 in the present example) specified by the Fault Type bit (add_fault_0_fault_type[1:0]), written to the bit location of the output word specified by the Bit Location word (add_fault_0_bitPlace[7:0]) (see the example pseudocode for the bit error injection components described above). Thus, the bit error injection component 404A injects an error on the data bus TD[137:0] based on the type of fault set in the fault test data register 402.

The example architecture depicted in FIG. 4 includes two bit error injection components, allowing up to two errors to be injected at two different memory locations for a given BIST sequence. However, the techniques described herein are not so limited, and it is to be appreciated that any number of bit error injection components (and corresponding words of the error injection register) can be included without departing from the scope of this disclosure.

After injection of the fault data at the target memory address, the BIST sequence continues as normal, performing a subsequent read operation on the target memory address to determine whether the value read from the address matches the test data value that had been sent to the address by the BIST controller. Upon determining that the value read from the target address is not the intended test data value, the BIST sequence assumes that the memory address is faulty. In accordance with the built-in self-repair features, detection of the fault at the specified location causes the BISR logic (which may be executed by the BIST controller 208 or another component of the memory architecture) to generate a repair instruction, which is sent to the repairable memory 202 by the BISR instruction block 210 (via output register BISR_CODE[15:0]). As noted above, this repair instruction can comprise a BISR code containing information that, when written to a fuse register, maps the presumed faulty memory address to an allocated redundant spare column.

Once the error has been injected at the specified location of memory 202, the user can wait until the current BIST sequence is complete (in some systems, completion of the BIST sequence may be indicated when a BIST_DONE bit goes high). Completion of the BIST sequence indicates that the injected fault has been detected, the BISR code has been written to the repairable memory 202, and a spare column (or other redundant memory area) has been allocated as a replacement for the faulty memory address. Thereafter, the BISR code that was generated in response to detection of the injected error can be read (e.g., through the JTAG or other user interface). As shown in FIG. 4, the BISR code (BISR_CODE[15:0]) can be mapped to a corresponding word of the fault test data register 402, allowing the code to be read via TAP controller 204. As will be described below, reading the BISR code that is generated in response to an injected error can assist the user in confirming correct operation of the built-in self-repair functionality.

After the current BIST sequence is complete, indicating that the error has been injected and the repair instructions have been deployed, the user can de-assert the Fault Enable bit (add_fault_en) of the fault test data register 402 so that a subsequent BIST can be performed without error injection. The user can then initiate another BIST, which will be performed normally without error injection. That is, multiplexor 406 will be set to only pass normal test data from memory interface 206 (TD[137:0]) to memory 202. Since the address location to which the fault data was injected during the previous BIST has been mapped to a spare column of repairable memory 202 (in accordance with the issued BISR code), read and write operations directed to this address location during this subsequent BIST will be performed on the allocated spare column(s). Thus, the one or more spare columns that were allocated as replacement memory locations for the error-injected memory locations can be validated as part of the current BIST using direct read and write operations directed to the spare columns. In an example BIST validation technique, writing a test data value directed to the error-injected memory address and confirming that the same data value is obtained when a subsequent read operation is directed to the error-injected memory address validates the spare column (rather than the main memory address), since the spare column was previously allocated to the main memory address during the repair operation performed in response to detection of the injected fault.

By repeating the error injection sequence and executing subsequent BIST sequences for other memory addresses, all spare columns can be validated as part of an overall self-test of the BISR memory.

In addition to validating the spare columns by including the spare columns in the BIST, the error injection sequence described above can also be used to confirm correct operation of the BISR logic by validating the BISR code generated in response to an injected error. For example, after the fault data has been injected at a specified location of repairable memory 202 as described above, the BISR code generated by the BISR logic and sent to the memory by BISR instruction block 210 can be read via TAP controller 204 (or other type of user interface). In the example illustrated in FIG. 4, the BISR code (BISR_CODE[15:0]) is mapped to a designated word of the fault test data register 402 so that the code can be read via TAP controller 204, or by a code validation script that executes on an internal component of the memory architecture (e.g., optional BISR logic validation component 410 or another component). A determination can then be made as to whether the generated BISR code is the expected repair code given the injected error and target address. This determination can be made by user observation or by the validation script executed by BISR logic validation component 410 (or another internal or external component).

In many systems, the BISR logic is designed to generate a different BISR code for each memory address that experiences a fault, and to generate the same BISR code for a given memory address regardless of the type of fault detected at that address. Accordingly, the BISR logic can be validated by confirming that each memory address to which an error is injected produces a distinct BISR code, as well as confirming that injecting different faults to the same memory address yields the same BISR code in response to the different faults. In some embodiments, this validation of the BISR logic can be carried out by the BIST controller 208 as part of the overall self-test operation, or by a separate component of the memory architecture (e.g., BISR logic validation component 410). For example, in addition to validating correct operation of the main memory and spare memory areas of the BISR memory, the BIST controller 208 (or BISR logic validation component 410) may be configured execute a BISR logic validation procedure that causes the error injection system 302 to inject faults to each main memory address of memory 202, and to confirm that the BISR code generated by the BISR logic (and read via the BISR_CODE[15:0] register) is different for each memory address. If errors injected to two different memory locations are found to generate the same error code, the BIST controller 208 (or BISR logic validation component 410) can output an alarm message via the TAP controller 204 indicating that the BISR logic is defective, and/or take another predefined action.

As an alternative to performing the BISR logic validation using a validation procedure executed by BIST controller 208 or BISR logic validation component 410, the BISR codes can be verified by user observation. In such embodiments, the user can interact with error injection system 302 as described above to inject faults at different memory locations and ensure that a different BISR code is generated for each address in response to the injected fault.

The BISR logic can be further validated by using error injection system 302 to write multiple different types of faults to the same memory address and confirming that the same BISR code is generated by the repair logic for the address for each type of fault. For confirmation based on user observation, a user can interact with error injection system 302 as described above to inject multiple faults of different types to the same memory address, and visually confirming that the same BISR code is generated for each injected fault. Alternatively, in some embodiments, one of the components of the memory architecture (e.g., the BIST controller 208, BISR logic validation component 410, or another component) can execute a BISR logic validation procedure that causes the error injection system 302 to, for each main memory address, write two different types of faults to the same memory address, read and record the corresponding two BISR codes generated in response to each fault, and confirm that the two BISR codes are the same. If the two codes are found to be different, the BIST controller 208 can output an alert via the TAP controller 204, and/or take another predefined action.

Validation of the memory system's BISR logic in this manner can also include confirming that errors injected to the spare memory columns allocated to a given memory address also produce the correct BISR code. A scenario in which fault data is injected to a spare memory column in order to further validate the BISR logic is now described. First, a spare column is rendered accessible to read/write operations using the error injection techniques described above. As in the example scenarios described above, the fault type, fault address, and bit location are set by writing the appropriate values to the following bits or words of the fault test data register 402:

add_fault_0_valid (Fault Valid),
    add_fault_0_fault_type[1:0] (Fault Type),
    add_fault_0_addr[12:0] (Fault Address),
    add_fault_0_bitPlace[7:0] (Bit Location), and
    add_fault_en (Fault Enable).

As described above, when the test address set by the BIST controller 208 becomes equal to the target address set in the Fault Address register, the fault data is written to the target address, and the memory system's BISR logic writes a BISR code (or other repair instruction) to the memory 202, causing a spare memory column to be allocated as a replacement memory area for the presumed defective memory address.

When the BIST sequence is complete, the BISR code generated in response to the injected fault can be read, either by the user via the TAP controller 204 or by a validation routine executed by an internal component of the memory system (e.g., the BIST controller 208, BISR logic validation component 410, etc.). In this example, the BISR code will only have eight bits valid, with the other eight bits being zero, since only a single error has been injected and therefore only a single column will be replaced.

In the previous example described above, the user next de-asserted the Fault Enable bit so that the subsequent BIST sequence would execute without error injection, thereby validating the spare memory column. In this example, the Fault Enable bit can instead remain asserted for the subsequent BIST sequence. Thus, during this subsequent BIST sequence, the same fault data will be written to the same memory address as in the previous BIST sequence. However, since the main memory address has been replaced with a spare column, the fault data will instead be written to the allocated spare column. As in the previous BIST sequence, the injected error will cause the BIST to fail, and the BISR logic will generate another BISR code. If the BISR code is operating correctly, this second failure should produce the same BISR code that was generated during the previous BIST sequence since, even though the fault data was written to the spare column, the data was directed to the main memory address being replaced by the spare column. Therefore, to validate the memory's BISR logic, this second BISR code can be read and compared with the first BISR code to confirm that both codes are the same. As in previous examples, this confirmation can be done by user observation by reading the codes via the TAP controller (or another user interface), or may be performed by validation logic that executes on one of the memory system's internal components (e.g., BISR logic validation component 410). This test can be repeated for all the main memory addresses and spare columns, thereby further validating correct operation of the memory system's BISR logic.

Using the error injection system 302 described above, a user can perform a more complete BIST validation of a BISRM memory by extending the BIST to spare memory columns that would otherwise be inaccessible during the BIST. By mimicking faults on selected memory addresses and forcing the memory system's BISR functionality to expose redundant spare memory columns to direct read and write operations, the error injection system 302 can render BIST validation more reliable relative to simulated testing. Moreover, since injection of simulated errors forces the memory system's BISR logic to execute, the error injection system 302 can also be used to confirm that the BISR logic is generated correct repair instructions for each memory address, thereby validating the BISR logic as well as the main memory and spare memory locations.

Figure 5:
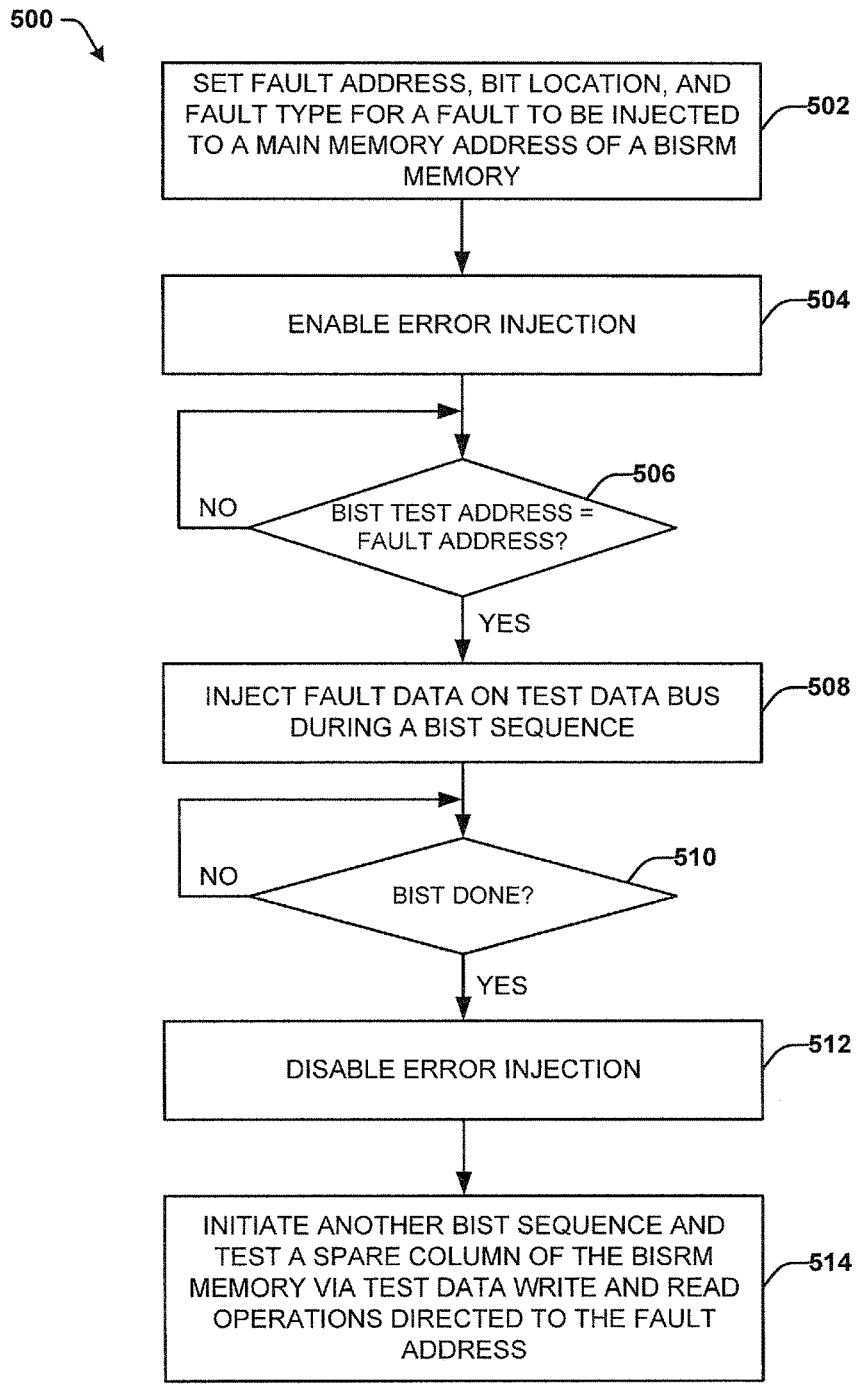
FIG. 5 illustrates a flow diagram of an example, non-limiting embodiment of a method for performing test read and write operations on spare columns of a BISRM memory as part of a built-in self-test sequence.

In view of the example systems described above, methods that may be implemented in accordance with the described subject matter may be better appreciated with reference to the flowcharts of FIGS. 5-6. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter. The methods described below can be implemented using hardware, software, or a combination of hardware and software implemented as on-board components of a memory architecture.

Referring to FIG. 5, a flow diagram of an example, non-limiting methodology 500 for performing test read and write operations on spare columns of a BISRM memory as part of a built-in self test sequence. Methodology 500 begins at step 502, where the fault address, bit location, and fault type for a fault to be injected to a main memory address of a BISRM memory are set. In some embodiments, the fault address, bit location, and fault type values can be written to allocated words of a fault test data register maintained on a component of the memory's architecture. At 504, error injection is enabled, either in response to an instruction received from the user or as part an automated validation routine executed by a component of the memory system. Steps 502 and 504 can be performed before or during a BIST sequence executed by the memory's BIST controller. The BIST sequence validates memory locations of the BISRM memory's main memory bank by writing test data to various memory addresses and confirming that the same test data is obtained during a subsequent test read operation directed to the memory address.

At 506, a determination is made as to whether the BIST test address currently set by the BIST controller is equal to the fault address set at step 502. This indicates that the BIST address pointer that determines which memory address will receive a current test read or write operation is currently pointing to the desired address to which the fault is to be injected. When the BIST test address is equal to the desired fault address (YES at step 506), the methodology proceeds to step 508, where fault data corresponding to the fault type set at step 502 is injected on the BIST test data bus. Thus, the fault data—rather than the intended test data—will be written to the test data address bit location corresponding to the bit location set at step 502.

After the fault data has been written, a determination is made at 510 as to whether the current BIST sequence is done. This indicates that the BIST controller has read the fault data from the target memory address and executed a repair operation to allocate a redundant spare column of the memory to replace the presumed defective main memory address. Accordingly, subsequent read/write operations directed to the memory address corresponding to the fault address will instead be performed on the allocated spare columns.

If it is determined that the BIST sequence is done (YES at step 510), the methodology proceeds to step 512, where error injection is disabled. This step can be performed in response to an instruction received from the user or from an automated validation routine. At 514, another BIST sequence is initiated, which will execute normally without performing error injection. During this subsequent BIST sequence, normal test data read/write operations directed to the memory address set at step 502 will now be performed on the spare column, which has replaced the memory address. In this way, the subsequent BIST sequence will validate the spare column using direct read/write operations performed on the spare column.

Figure 6A:
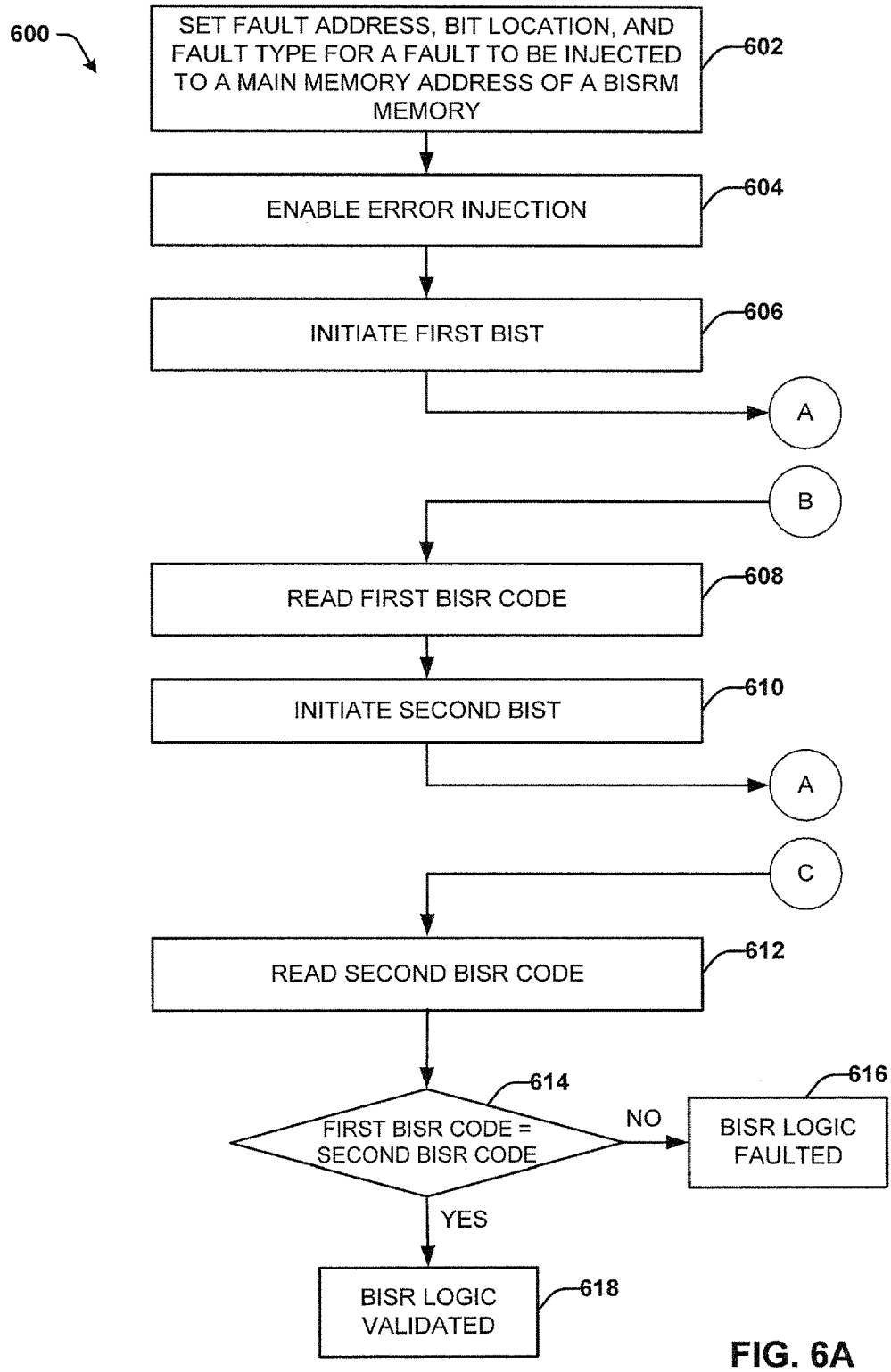
FIGS. 6A and 6B illustrates a flow diagram of an example, non-limiting embodiment of a method for confirming correct operation of BISR logic that carries out built-in self-repair operations in a BISRM memory system.
Figure 6B:
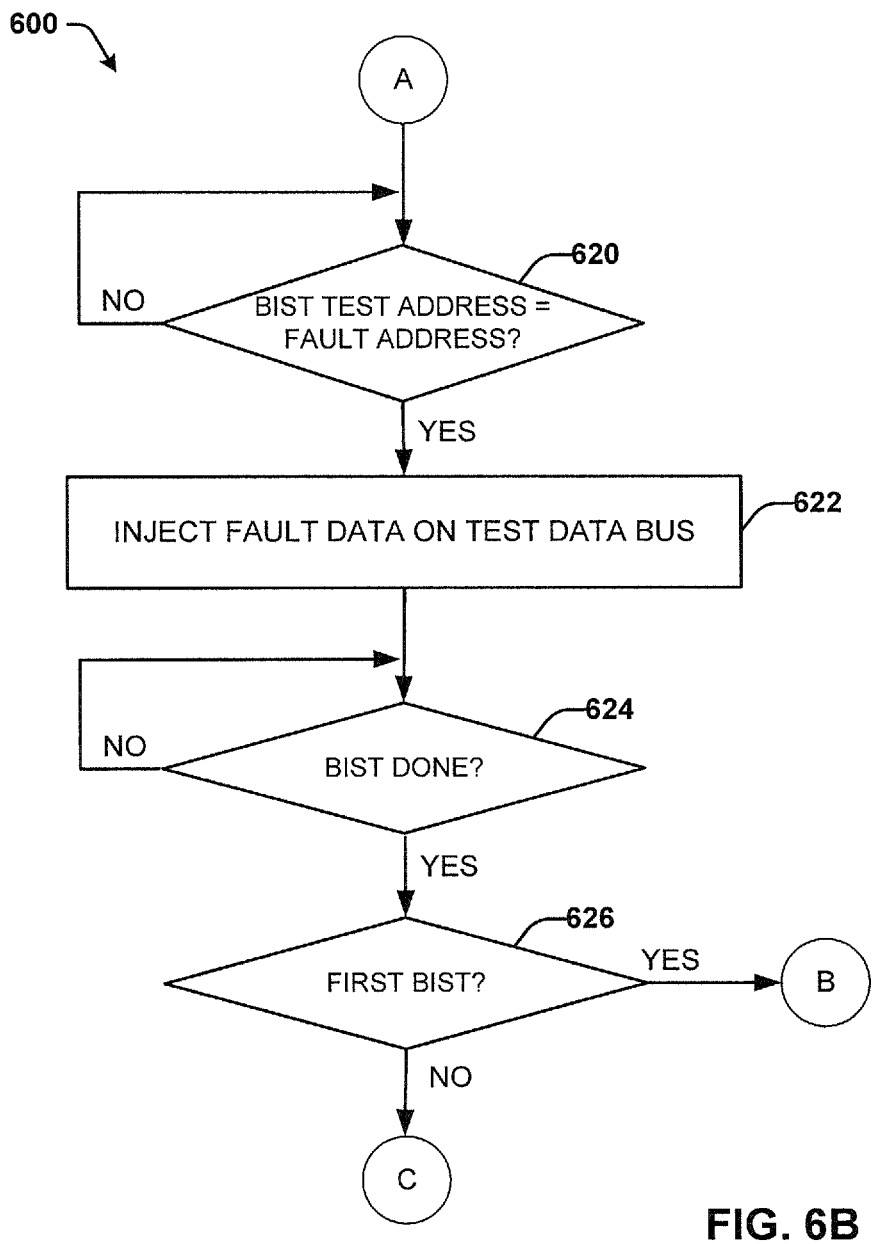

Referring to FIGS. 6A and 6B, a flow diagram of an example, non-limiting methodology 600 for confirming correct operation of BISR logic that carries out built-in self-repair operations in a BISRM memory system. In particular, methodology 600 verifies that detection of a fault at a given memory address causes the BISR logic to generate the same BISR code (or other repair instruction) regardless of whether the fault is detected on the main memory address or on a spare memory area allocated to the main memory address. Methodology 600 begins at step 602, where the fault address, bit location, and fault type for a fault to be injected to a main memory address of a BISRM memory are set. As in previously described examples, the fault address, bit location, and fault type values can be written to allocated words of a fault test data register maintained on a component of the memory's architecture. At 604, error injection is enabled, either in response to an instruction received from the user or as part an automated BISR validation routine executed by a component of the memory system.

At 606, a first BIST is initiated. The methodology then proceeds to the error injection sequence depicted in FIG. 6B. The error injection sequence is similar to that described above in connection with methodology 500. The BIST sequence writes test data to various memory addresses of the BISRM memory and confirms that the same test data is obtained when a subsequent test read operation directed to the memory address is performed. During this BIST sequence, at step 620, a determination is made as to whether the BIST test address currently set by the BIST controller is equal to the fault address set at step 602. When the BIST test address becomes equal to the fault address (YES at step 620, the methodology proceeds to step 622, where fault data is injected on the data bus to facilitate writing of the error data to the fault address.

At 624, a determination is made as to whether the current BIST sequence is complete (e.g., by monitoring the state of a BIST Done bit). When the BIST sequence is complete (YES at step 614), the methodology proceeds to step 626. Since the completed BIST sequence is the first BIST (YES at step 626), the methodology returns to step 608 of FIG. 6A and the first BISR code generated by the BISR logic in response to the injected fault data is read.

At 610, a second BIST sequence is initiated, and the fault injection sequence of FIG. 6B is run a second time. During this second BIST sequence, since the previous BISR repair operation caused a spare column of the BISRM memory to be allocated as a replacement for the presumed faulty main memory address, the fault data is now written to the allocated spare column rather than the main memory address when the fault data is injected on the test data bus at step 622. The BIST logic will generate a second BISR code in response to detecting the fault data on the spare column. Since this is the second BIST sequence (NO at step 626), the methodology returns to step 612 of FIG. 6A upon completion of this second BIST sequence.

At step 612, the second BISR code generated by the BISR logic in response to the second injected error is read. At 614, a determination is made as to whether the first BISR code is equal to the second BISR code. In this example, the BISR logic should generate the same BISR code in response to detection of the fault on either the main memory address or its allocated spare column. Accordingly, if it is determined that the first BISR code is equal to the second BISR code (YES at step 614), the methodology proceeds to step 618, where the BISR logic is validated. Alternatively, if it is determined that the first BISR code does not equal the second BISR code (NO at step 614), the methodology proceeds to step 616, where the BISR logic is determined to be defective. In some embodiments, step 616 can also cause an error message to be generated indicating that the BISR logic is invalid and identifying the memory address that is being handled improperly by the BISR logic.

Methodology 600 can be modified to perform other types of validation on the BISR logic. For example, after reading the first BISR code at step 608, the fault address that was set at step 602 can be changed to a different address prior to initiating the second BIST sequence at step 610, causing the second BIST sequence to inject the fault data to a different memory address. In this scenario, the first and second BISR codes should be different, since each memory address should produce a distinct BISR code. Accordingly, steps 614, 616, and 618 can be modified such that the BISR logic will fault in response to a determination at step 614 that the first and second BISR codes are equal. Otherwise, the BISR logic will be validated.

Example Computing Environment

Figure 7:
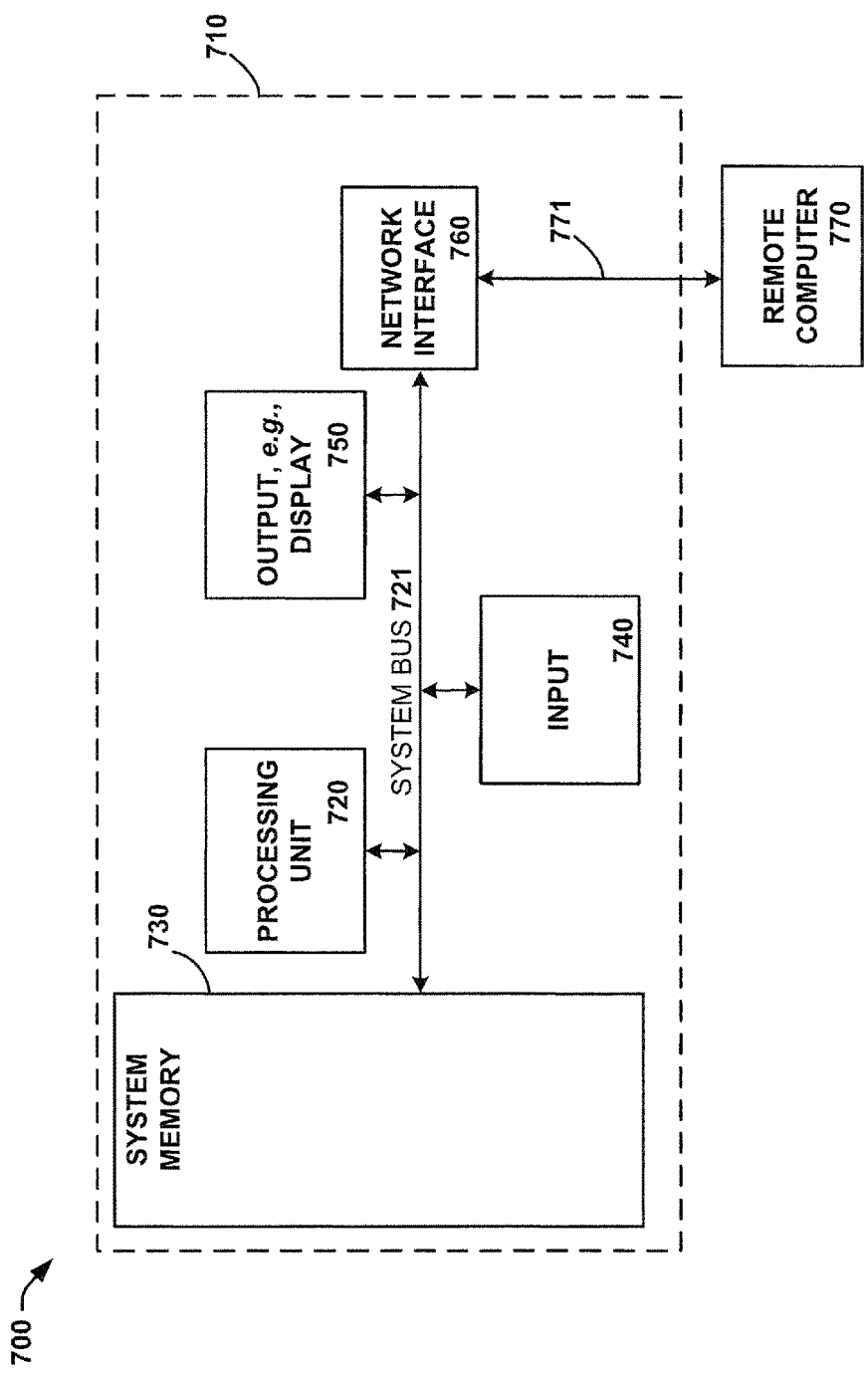
FIG. 7 illustrates a block diagram of an example electronic computing environment that can be implemented in conjunction with one or more aspects described herein.

As mentioned, advantageously, the techniques described herein can be applied to any device where it is desirable to facilitate large receive offload functionality. It is to be understood, therefore, that handheld, portable and other computing devices and computing objects of all kinds are contemplated for use in connection with the various non-limiting embodiments, i.e., anywhere that a device may wish to implement large receive offload functionality. Accordingly, the below general purpose remote computer described below in FIG. 7 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 7 thus illustrates an example of a suitable computing system environment 700 in which some aspects of the disclosed subject matter can be implemented, although as made clear above, the computing system environment 700 is only one example of a suitable computing environment for a device and is not intended to suggest any limitation as to the scope of use or functionality of the disclosed subject matter. Neither should the computing system environment 700 be interpreted as having any dependency or requirement relating to any one or combination of components illustrated in the exemplary computing system environment 700.

With reference to FIG. 7, an exemplary device for implementing the disclosed subject matter includes a general-purpose computing device in the form of a computer 710. Components of computer 710 may include, but are not limited to, a processing unit 720, a system memory 730, and a system bus 721 that couples various system components including the system memory to the processing unit 720. The system bus 721 may be any of several types of bus structures including a memory bus or memory controller, a peripheral bus, and a local bus using any of a variety of bus architectures.

Computer 710 typically includes a variety of computer readable media. Computer readable media can be any available media that can be accessed by computer 710. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 710. Communication media typically embodies computer readable instructions, data structures, program modules, or other data in a modulated data signal such as a carrier wave or other transport mechanism and includes any information delivery media.

The system memory 730 may include computer storage media in the form of volatile and/or nonvolatile memory such as read only memory (ROM) and/or random access memory (RAM). A basic input/output system (BIOS), containing the basic routines that help to transfer information between elements within computer 710, such as during start-up, may be stored in memory 730. Memory 730 typically also contains data and/or program modules that are immediately accessible to and/or presently being operated on by processing unit 720. By way of example, and not limitation, memory 730 may also include an operating system, application programs, other program modules, and program data.

The computer 710 may also include other removable/non-removable, volatile/nonvolatile computer storage media. For example, computer 710 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 721 through a non-removable memory interface such as an interface, and a magnetic disk drive or optical disk drive is typically connected to the system bus 721 by a removable memory interface, such as an interface.

A user can enter commands and information into the computer 710 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 720 through user input 740 and associated interface(s) that are coupled to the system bus 721, but may be connected by other interface and bus structures, such as a parallel port, game port, or a universal serial bus (USB). A graphics subsystem can also be connected to the system bus 721. A projection unit in a projection display device, or a HUD in a viewing device or other type of display device can also be connected to the system bus 721 via an interface, such as output interface 750, which may in turn communicate with video memory. In addition to a monitor, computers can also include other peripheral output devices such as speakers which can be connected through output interface 750.

The computer 710 can operate in a networked or distributed environment using logical connections to one or more other remote computer(s), such as remote computer 770, which can in turn have media capabilities different from computer 710. The remote computer 770 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 710. The logical connections depicted in FIG. 7 include a network 771, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 710 can be connected to the network 771 through a network interface or adapter. When used in a WAN networking environment, the computer 710 can typically include a communications component, such as a modem, or other means for establishing communications over the WAN, such as the Internet. A communications component, such as wireless communications component, a modem and so on, which can be internal or external, can be connected to the system bus 721 via the user input interface of input 740, or other appropriate mechanism. In a networked environment, program modules depicted relative to the computer 710, or portions thereof, can be stored in a remote memory storage device. It will be appreciated that the network connections shown and described are exemplary and other means of establishing a communications link between the computers can be used.

Example Networking Environment

Figure 8:
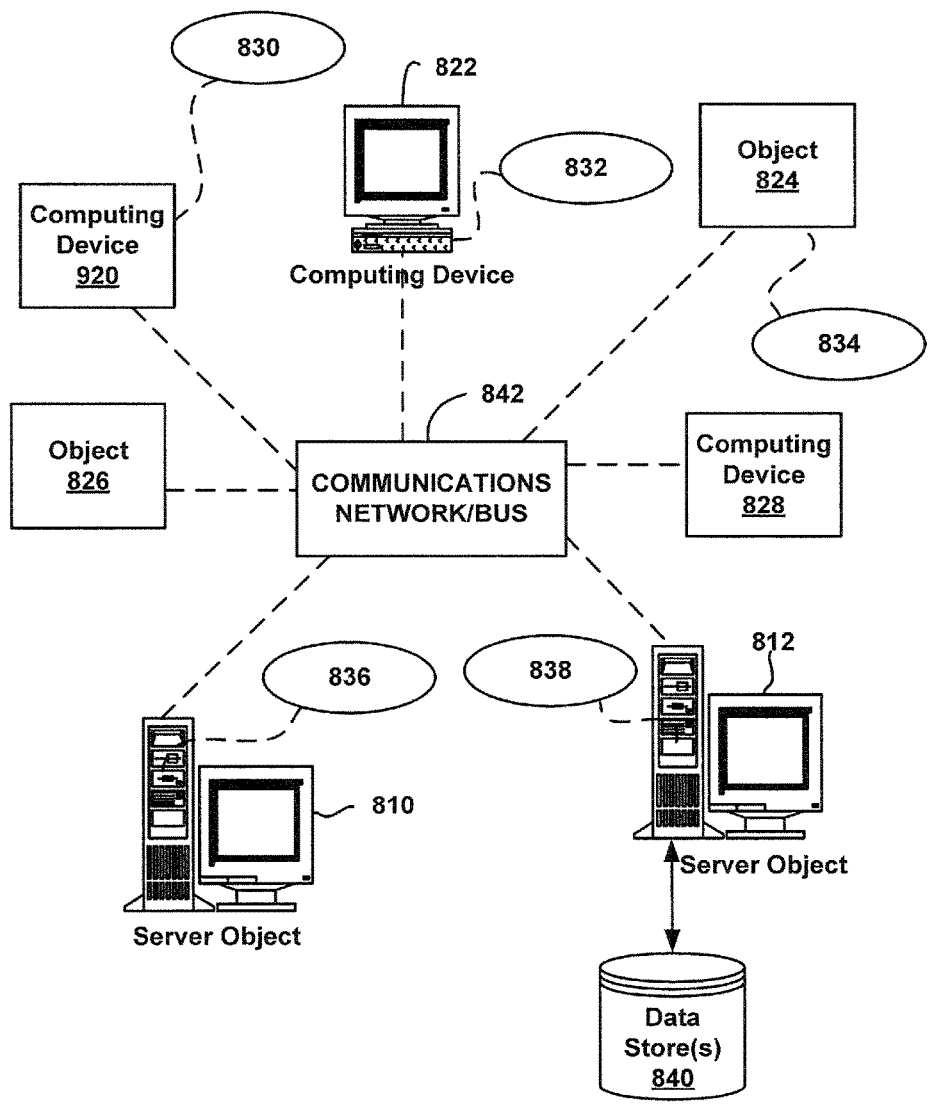
FIG. 8 illustrates a block diagram of an example data communication network that can be operable in conjunction with various aspects described herein.

FIG. 8 provides a schematic diagram of an exemplary networked or distributed computing environment. The distributed computing environment comprises computing objects 810, 812, etc. and computing objects or devices 820, 822, 824, 826, 828, etc., which may include programs, methods, data stores, programmable logic, etc., as represented by applications 830, 832, 834, 836, 838 and data store(s) 840. It can be appreciated that computing objects 810, 812, etc. and computing objects or devices 820, 822, 824, 826, 828, etc. may comprise different devices, including a multimedia display device or similar devices depicted within the illustrations, or other devices such as a mobile phone, personal digital assistant (PDA), audio/video device, MP3 players, personal computer, laptop, etc.

Each computing object 810, 812, etc. and computing objects or devices 820, 822, 824, 826, 828, etc. can communicate with one or more other computing objects 810, 812, etc. and computing objects or devices 820, 822, 824, 826, 828, etc. by way of the communications network 1042, either directly or indirectly. Even though illustrated as a single element in FIG. 8, communications network 1042 may comprise other computing objects and computing devices that provide services to the system of FIG. 8, and/or may represent multiple interconnected networks, which are not shown. Each computing object 810, 812, etc. or computing object or devices 820, 822, 824, 826, 828, etc. can also contain an application, such as applications 830, 832, 834, 836, 838, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 8, as a non-limiting example, computing objects or devices 820, 822, 824, 826, 828, etc. can be thought of as clients and computing objects 810, 812, etc. can be thought of as servers where computing objects 810, 812, etc., acting as servers provide data services, such as receiving data from client computing objects or devices 820, 822, 824, 826, 828, etc., storing of data, processing of data, transmitting data to client computing objects or devices 820, 822, 824, 826, 828, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1042 or bus is the Internet, for example, the computing objects 810, 812, etc. can be Web servers with which other computing objects or devices 820, 822, 824, 826, 828, etc. communicate via any of a number of known protocols, such as the hypertext transfer protocol (HTTP). Computing objects 810, 812, etc. acting as servers may also serve as clients, e.g., computing objects or devices 820, 822, 824, 826, 828, etc., as may be characteristic of a distributed computing environment.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, ...) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory system, comprising:
a built-in self-repairable memory (BISRM) comprising a main memory area and a redundant memory area comprising at least one spare column;
a built-in-self test (BIST) controller configured to validate memory locations of the main memory area by writing test data to the memory locations via a test data bus;
an error injection system configured to inject first fault data and second fault data to a first memory location, of the memory locations, via the test data bus;
wherein the BIST controller is further configured to,
in response to a detection of the first fault data at the first memory location, generate a first repair instruction configured to perform an allocation of a first spare column of the at least one spare column, as a replacement memory area for the memory location; and
in response to a detection of the second fault data at the first memory location and after the allocation of the first spare column, generate a second repair instruction configured to perform an allocation of a second spare column of the at least one spare column, as a replacement memory area for the first memory location; and
a built-in self repairable (BISR) logic verification component configured to generate an error message in response to a determination that the second repair instruction is different than the first repair instruction.

2. The memory system of claim 1, wherein the allocation of the first spare column causes at least one of a read operation or a write operation directed to the first memory location by the BIST controller to be performed on the first spare column.

3. The memory system of claim 1, wherein the error injection system comprises at least one error injection component configured to generate the first fault data in accordance with first fault configuration data written to a first fault test data register.

4. The memory system of claim 3, wherein the first fault configuration data comprises at least first fault address data specifying a first memory address of the BISRM to which the first fault data is to be written.

5. The memory system of claim 4, wherein the error injection system is configured to switch a test data input of the BISRM from the test data bus to an output of the error injection component in response to determining that a test data address pointer of the BIST controller is equal to the first memory address specified by the first fault address data.

6. The memory system of claim 4, wherein the first fault configuration data comprises at least bit location data specifying a bit location to which the first fault data is to be written.

7. The memory system of claim 4, wherein the first fault configuration data comprises at least first fault type data specifying a type of the first fault data.

8. The memory system of claim 7, wherein the error injection system comprises at least one error injection component configured to generate the second fault data in accordance with second fault configuration data written to a second fault test data register.

9. The memory system of claim 8, wherein the second fault configuration data comprises at least second fault address data specifying a second memory address of the BISRM to which the second fault data is to be written.

10. The memory system of claim 9, wherein the first memory address and the second memory address are identical.

11. The memory system of claim 10, wherein the second fault configuration data comprises at least second fault type data specifying a type of the second fault data.

12. The memory system of claim 11, wherein the first fault type and the second fault type are identical.

13. The memory system of claim 11, wherein the first fault type is different from the second fault type.

14. The memory system of claim 3, further comprising a user interface configured to set the first fault configuration data in accordance with user-defined configuration input.

15. The memory system of claim 1, wherein the first fault data and the second fault data are identical.

* * * * *